United States Patent [19]
Heinrich et al.

[11] Patent Number: 5,527,394
[45] Date of Patent: Jun. 18, 1996

[54] APPARATUS FOR PLASMA ENHANCED PROCESSING OF SUBSTRATES

[75] Inventors: Friedhelm Heinrich; Peter Hoffmann, both of Berlin, Germany

[73] Assignee: Fraunhofer Gesellschaft zur Forderung der Angewandten Forschung e.V., Munich, Germany

[21] Appl. No.: 157,194

[22] PCT Filed: Jun. 9, 1992

[86] PCT No.: PCT/DE92/00471

§ 371 Date: May 13, 1994

§ 102(e) Date: May 13, 1994

[87] PCT Pub. No.: WO92/22920

PCT Pub. Date: Dec. 23, 1992

[30] Foreign Application Priority Data

Jun. 8, 1991 [DE] Germany .......................... 41 18 973.6

[51] Int. Cl.⁶ .................................................. C23C 16/00
[52] U.S. Cl. ................... 118/723 E; 118/723 MP; 156/345; 204/298.39; 204/298.37
[58] Field of Search .............. 118/723 R, 723 E, 118/723 MR, 723 MA; 156/345; 204/298.06, 298.14, 298.16, 298.17, 298.18, 298.19, 298.21, 298.34

[56] References Cited

U.S. PATENT DOCUMENTS

| | | | |
|---|---|---|---|
| 4,668,338 | 5/1987 | Maydan | 156/643 |
| 4,668,365 | 5/1987 | Foster | 204/192 |
| 5,110,437 | 5/1992 | Yamada | 204/298 |
| 5,160,398 | 11/1992 | Yanagida | 118/723 E |
| 5,225,024 | 7/1993 | Hanley | 118/345 |
| 5,252,178 | 10/1993 | Moslehi | 156/643 |
| 5,292,401 | 3/1994 | Yoneda | 118/723 E |
| 5,312,778 | 5/1994 | Collins | 437/225 |

*Primary Examiner*—R. Bruce Breneman
*Assistant Examiner*—Joni Y. Chang
*Attorney, Agent, or Firm*—Antonelli, Terry, Stout & Kraus

[57] ABSTRACT

Disclosed is an apparatus for plasma-enhanced processing of substrates, having a recipient in which ions and reactive neutral particles (radicals) formed in plasma act on the substrate.

The present invention is distinguished by having means for varying the plasma volume are provided in order to control the absolute values of the ionic current densities and the radical current densities and in order to control the relative ratio of the ionic current densities and the radical current densities on the surface of the substrate.

10 Claims, 5 Drawing Sheets

APPARATUS FOR PLASMA ENHANCED PROCESSING OF SUBSTRATES

DESCRIPTION

1. Technical Field

The present invention relates to an apparatus for plasma-enhanced processing of substrates having a recipient in which ions and reactive neutral particles (radicals) formed in the plasma act on the substrate.

Apparatuses of this type for plasma-enhanced processing are utilized both in the removal as well as in the deposition of material from, respectively on, semiconductor, metal, glass or plastic substrates.

The processing procedures carried out in apparatuses of this type are based on the combined action of the ions and of the reactive neutral particles (radicals) formed in the plasma. Whereas the neutral particles essentially strike the substrate (wafer) with thermal velocity and isotropic distribution, the ions reach the wafer with relatively great kinetic energy and strong predominant orientation.

2. State of the Art

Utilization of additional magnetic fields in plasma-enhanced processing procedures, such as e.g., in dry etching or in layer deposition, is known from a number of publications, by way of illustration DE 39 13 463 A1 or DE 38 01 205 C1.

In addition, reference is made to the publications "Magnetically Enhanced Plasma Deposition and Etching" in *Solid State Technology*, April 1987, pp. 99–104, "A Magnetic Multipole Reactor for High-flux Reactive Ion Etching" in *J. Appl. Phys.* 63(6), pp. 1899–1903, and "RF Broad Beam Ion Source for Reactive Sputtering" in *Vacuum*, 1986, pp. 973–976.

In these state of the art apparatuses, magnetic fields are utilized with the aim of retaining the electrons as long as possible in the plasma and thereby raise their density and probabilty of collision. In this manner, ion production is raised, as well as to a certain degree, the production of radicals. Furthermore, magnetic fields are utilized to control the plasma volume in the recipient in such a way that only the reactive neutral particles formed in the plasma can reach the substrate.

DESCRIPTION OF THE INVENTION

An element of the present invention is that it was understood that, in apparatuses for plasma-enhanced processing of substrates having a recipient in which ions and reactive neutral particles (radicals) formed in the plasma act on the substrate, the results of the processing are determined not only by the absolute value of the ionic and radical current densities on the surface of the substrate, but also by the ratio $r$ of the ionic to the radical current densities $r = j_{ion}/j_{rad}$.

In the state of the art apparatuses for plasma-enhanced processing of substrates having a recipient in which ions and reactive neutral particles (radicals) formed in the plasma act on the substrate, as they are by way of illustration known from the afore-mentioned publications, it is however not possible to adjust the ionic and radical current densities in a concerted manner.

The object of the present invention is to provide an apparatus for plasma-enhanced processing of substrates having a recipient in which ions and reactive neutral particles (radicals) formed in the plasma act on the substrate, in which the ionic and radical current densities can largely be adjusted independently of each other.

An inventive solution to this object is set forth in claim 1. Further improvements of the present invention are put forth in the subclaims.

An element of the present invention is, therefore, to improve an apparatus for plasma-enhanced processing of substrates in such a manner that means for varying the plasma volume are provided to control the absolute values of the ionic and radical current densities and to control the relative ratio of ionic to radical current densities on the surface of the substrate.

The present invention is based on the fundamental concept of adjusting the individual current densities by means of concerted variation of the plasma volume, by way of illustration, by utilizing specific magnetic field configurations or geometry of the recipient.

The invented apparatus permits in this way raising the absolute current density of ions and radicals (chemical reactive neutral particles) as well as controlled adjustment of the current ratio $r$.

BRIEF DESCRIPTION OF THE DRAWING

The present invention is made more apparent by way of illustration without the intention of limiting the spirit or scope of the overall inventive concept in the following using preferred embodiments with reference to the accompanying drawing, to which is to be referred for the disclosure of any inventive details not explained in more detail herein. Depicted is.

DESCRIPTION OF PREFERRED EMBODIMENTS

In the following description, the same reference numbers are employed for the same parts thus obviating renewed presentation of these parts.

Figure 1:
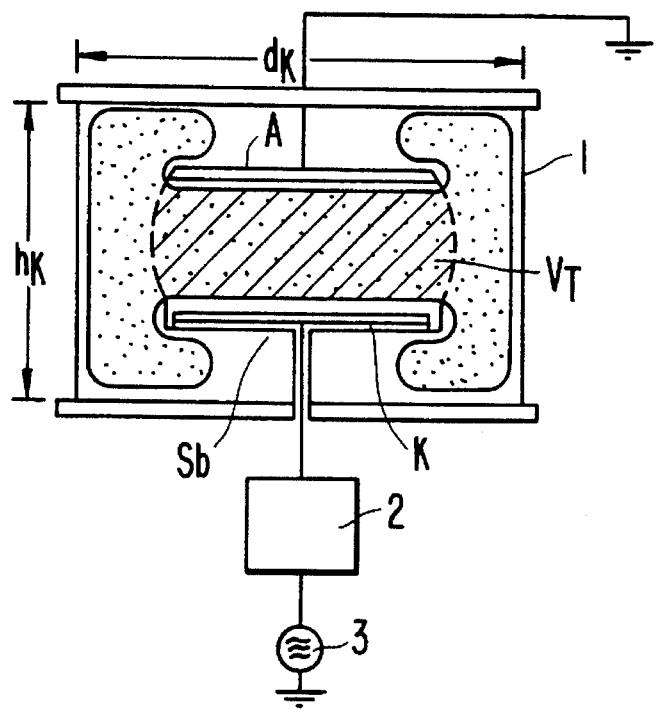
FIG. 1 illustrating a longitudinal section of a generic apparatus in order to illustrate the principles of the present invention.

To illustrate the inventive fundamental principles, FIG. 1 shows an apparatus for plasma-enhanced processing of substrates in a recipient 1 i.e., receptacle or container, which by way of example may be a cylindrical chamber having an inside height of $h_K$ and a diameter of $d_K$. An electrode K (cathode) which is connected to a high-frequency power source 3 via a four-wire network 2 is disposed in the recipient 1. A stands for a counter-electrode (anode) which is connected to the reference potential and Sb stands for the substrate to be processed.

In the apparatuses illustrated in FIG. 1, like those known from the state of the art, i.e., plasma volumes as well as the current densities j of the ions and radicals adjust in the direction of the substrate Sb depending on the selection of the procedure conditions (e.g., reactor geometry, procedure pressure, gas flow, coupled-in power) more or less automatically.

The consequences for the ion and radical current densities on the substrate Sb due to the variation of the plasma volume provided in accordance to the present invention are explained in the following:

The continuity equation $$\operatorname{div} j = P \quad (1)$$

illustrates the balance equation of the production and leakage rates, with P standing for the ion and radical production rates in the plasma volumes and j the current density of the particles flowing off out of a volume element.

If the production rate P is constant in the plasma volume $V_p$ and if the volume losses are initially neglected, the integration of equation 1 yields the following equation $$\int j \, dA = P V_p \quad (2)$$

with the integration running over the entire plasma surface $A_p$.

In the integration of the equation (2), a difference should be made between two cases:
(1) In the case of low pressures, respectively high powers, the plasma will expand independently of the special arrangement of electrodes K and A to practically the entire chamber volume $V_p = V = h_K \ast d_k^4 / 4$. For the ions and the neutral particles, the leakage surfaces in this event equal the chamber surface A. The ionic, respectively radical current, densities thus are $$j^{ion} = p^{ion} V / A \quad (3)$$

$$j^{rad} = p^{rad} V / A^{rad} \quad (4)$$

$A^{rad}$ is an effective leakage surface, which is dependent on the geometry and the nature of the material of the chamber as well as on the pump output.
(2) If the plasma volume $V_p$ is reduced to a value $V_r$ which is less than the chamber volume (the index r stands for this case), $$J_r\mathit{ion} = P_r\mathit{ion} V_r / A_r \quad (5)$$

holds true for the ion current densities at constant P.
For the neutral particles, $$j_r\mathit{rad} = P_r\mathit{rad} \, V_r / A_{rad} \quad (6)$$

holds true.

This equation takes into consideration that there is essentially a leakage of neutral particles at the walls of the chamber. $A^{rad}$ does, therefore, not alter when the plasma volume is reduced. The change in the ionic current densities then occurs according to the equations (3) and (5), as that of the radicals, i.e. of the reactive neutral particles, to the equations (4) and (6).

If it is assumed that the behavior of the ion and radical production rates is comparable, the flow conditions and their change "a" become $$a = (j_r^{ion}/j_r^{rad}) : (j^{ion}/j^{rad}) = A/A_r \quad (7)$$

i.e., the flow conditions change like the conditions of the plasma surfaces responsible for ion removal.

If the plasma, which in the most favorable case is restricted to the area of the electrodes K and A, is contracted, the overall ionic current to the substrate surface increases due to the rise in power density and the diminished leakage at the wall, at constant overall power. The radical current density does not increase to the same extent.

The ratio $r = j_{ion}/j_{rad}$ of the current densities on the substrate Sb rises by a factor $A/A_r$, with A standing for the overall surface which is determined by the walls of the chamber and the surface of the substrate, and $A_r$ standing for the reduced ion-leakage surface.

If there is a contraction between the electrodes K and A (the hatched area in FIG. 1), the reduced ion leakage surface $A_r$ will equal the two-fold electrode surface, because no ions flow off to the sides. For example, employing a chamber having a height of $h_K = 20$ cm and a diameter of $d_K = 50$ cm and a substrate having a diameter of $d_W = 20$ cm (8" wafer) yields a variation range of the ratio of ion current density to neutral particle current density of more than 20 (!) by means of controlling the plasma volume.

This is, in particular, advantageous in the case of anisotropic structuring, in which high ionic current densities in relation to the radical current densities are desirable.

In the following, apparatuses for plasma-enhanced processing of substrates are described in which, depending on application, respectively desired ratio of ionic current densities to radical current densities, specific plasma volumes, respectively surfaces, are realized by means of suited magnetic field/recipient configurations.

Figure 2A:
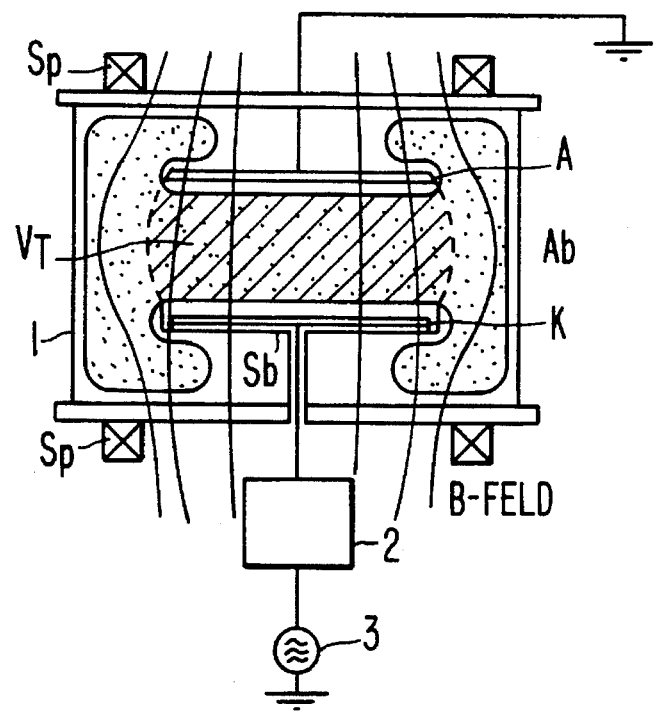
FIG. 2a to 2c illustrate variants of a first preferred embodiment, FIG. 3 illustrate a second preferred embodiment, FIG. 4 illustrate a third preferred embodiment.
Figure 2B:
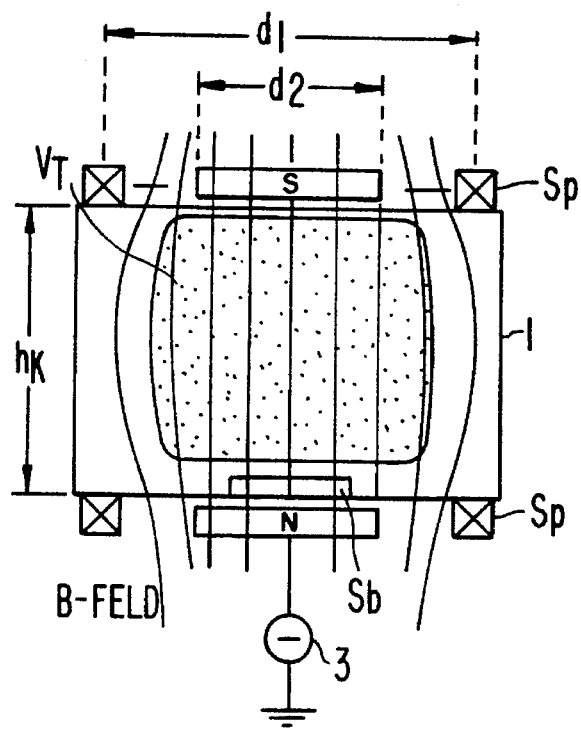
Figure 2C:
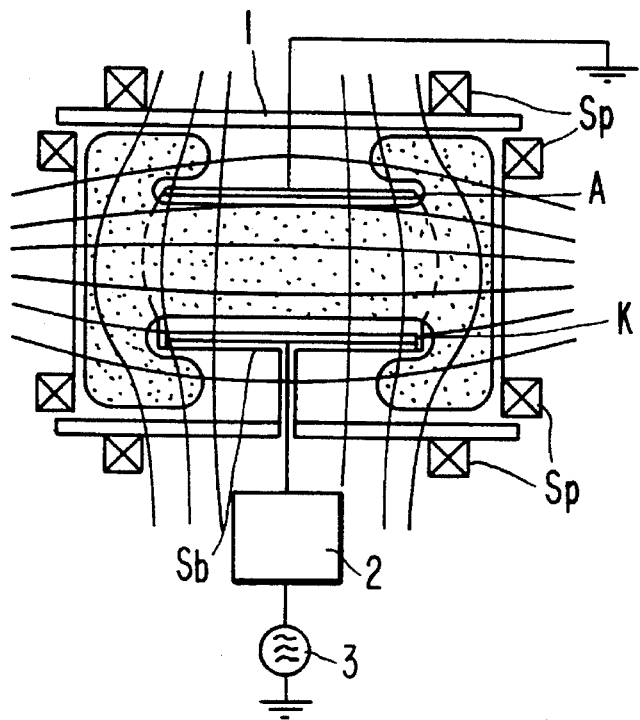

In the following figures, the same reference numbers stand for the same or corresponding parts as in FIG. 1 obviating renewed presentation, and only deviations of the preferred embodiments illustrated in these figures from the first preferred embodiment are explained:

FIGS. 2a to 2c show variants of a first preferred embodiment in which the ratio of positive ionic current densities are raised. For this purpose, magnetic fields are provided which are generated by electro-magnets Sp (FIG. 2a) or by permanent magnets lying opposite each other.

This configuration can be employed with particular advantage if the portion of ion-induced surface processes is to be intensified as, e.g., is the case of anisotropic structure transfer (etching) or in ion-induced deposition, etc.

The effect of the magnetic field (B-field) generated by magnets Sp is the following:

Electron diffusion perpendicular to the B-field lines is restricted in such a manner that the positive ions also emerge with diminished current densities in this direction. In this way, if the B-fields are sufficiently high, the electrons and thus the ions are held in the reduced volume $V_r$. Varying the magnetic field B, e.g., by altering the coil currents or the employed permanent magnetic arrangement, permits adjusting $V_r$ and thus the ratio r of the ion current densities to the radical current densities. The maximum adjustable current densities ratio r are, as already explained, determined by the substrate surfaces.

The plasma contraction is attained in the preferred embodiment illustrated in FIG. 2a by the coils SD which are disposed concentrically to the electrodes K and A. Employing, e.g. coils, in Helmholtz configuration yields a homogenous B-field distribution over the entire plasma area. The magnetic field lines are perpendicular to the electrodes (substrate) surface. In this manner, radial diffusion is hindered. The plasma volume can thus be changed depending on the set magnetic field strength.

Furthermore, the distance Ab between the electrodes K and A may be varied, thereby yielding an additional variation of the plasma composition and the currents. In particular, by reducing the distance between the electrodes, the power density in the plasma volume can be greatly increased at constantly applied overall power. The plasma can be held between the electrodes even in the case of high power densities and low pressures (!) by the magnetic fields.

It is explicitly pointed out that the mode of generating the magnetic fields is of no import.

As FIG. 2b shows, the same results can be obtained, e.g., also by means of permanent magnets N and S and/or coils Sp, which are concentric to the drawn axes, integrated in the electrodes having magnetic field lines as illustrated.

The basic setup of the variant illustrated in FIG. 2b is similar to the one in FIG. 2a. The difference is that there does not need to be a particularly shaped counter electrode A. In this case, the entire chamber 1 serves as a counter electrode. The minimally adjustable plasma volume is determined by the effective area of the magnetic field, the former, e.g., can be varied when employing magnetic field coils Sp by means of their diameter $d_1$ or by the diameter $d_2$ of the permanent magnets N and S.

Although a seemingly similar apparatus is described in DE 38 01 205 C1, in which a magnetic arrangement having B-lines running perpendicular to the surface (parallel to the electric field in the cathode dark space) is employed. This state-of-the-art, however, has neither an especially shaped counter electrode having, e.g., the additional possibility of varying the spacing of the cathode, nor is the plasma volume varied with the B-field.

FIG. 2c shows that, in addition to the setup illustrated in FIGS. 2a and 2b, magnetic fields running parallel to the surface of the substrate Sb can be employed. In this way, the electrons and thus also the ion movement onto the substrate can be additionally influenced. Although the DE 39 13 463 A1 also already mentions the use of magnetic fields which run approximately parallel to the surface of the substrate, in the preferred embodiment illustrated in FIG. 2c, however, the magnetic field encloses the electrodes and, in particular, the cathode K. Consequently, the movement of the electrons in the cathode dark space and thus the DC self bias can be additionally influenced:

Increasing the B-field running parallel to the wafer surface prevents the movement of electrons to the wafer, which therefore receives a weaker charge. The result is a reduction of the DC self bias and therefore of the ion striking energies. Influencing the radicals and ionic currents is not foreseen. This occurs with the B-field running perpendicular to the surface.

The diameters of the coils Sp employed in FIGS. 2a and 2c can be varied within large ranges. The coil diameters can, e.g., be much larger than the dimensions of chamber 1. The pairs of coils do not necessarily have to be concentric to the axis of the chamber and/or axes of the electrodes. Usually, however, it is endeavored to have homogenous magnetic fields between the electrodes K and A. Pairs of coils in Helmholtz configuration (coil diameter=distance between the coils) have much to recommend them.

Naturally, permanent magnets may also be utilized instead of coils.

Figure 3:
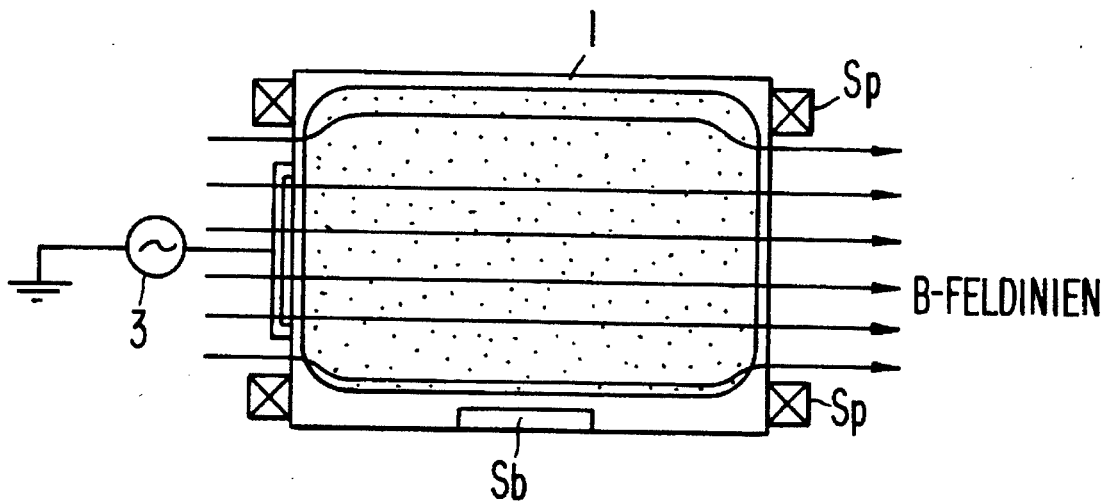

FIG. 3 shows a second preferred embodiment of the present invention in which the contraction of the plasma raises the relative radical current density, i.e. the relative current density of the reactive neutral particles.

In this preferred embodiment of the present invention, the magnetic field lines run parallel to the surface of the substrate Sb in such a manner that the ionic current densities toward the substrate are reduced. The relatively increasing portion of radicals stimulates the purely chemically component in the surface processing, e.g. for the generation of isotropic etching profiles, for thermic deposition of layers on the substrate, etc.

The power input occurs outside the substrate electrode via a laterally disposed electrode E. By introducing a variable magnetic field, the mobility of the electrons in the direction of the substrate Sb and thus the ionic currents on the substrate can be diminished. The ionic current densities can thus be adjusted continuously. With suitably high B-fields, the ionic current to the substrate can be completely suppressed so that solely neutral particles can reach the substrate.

Figure 4:
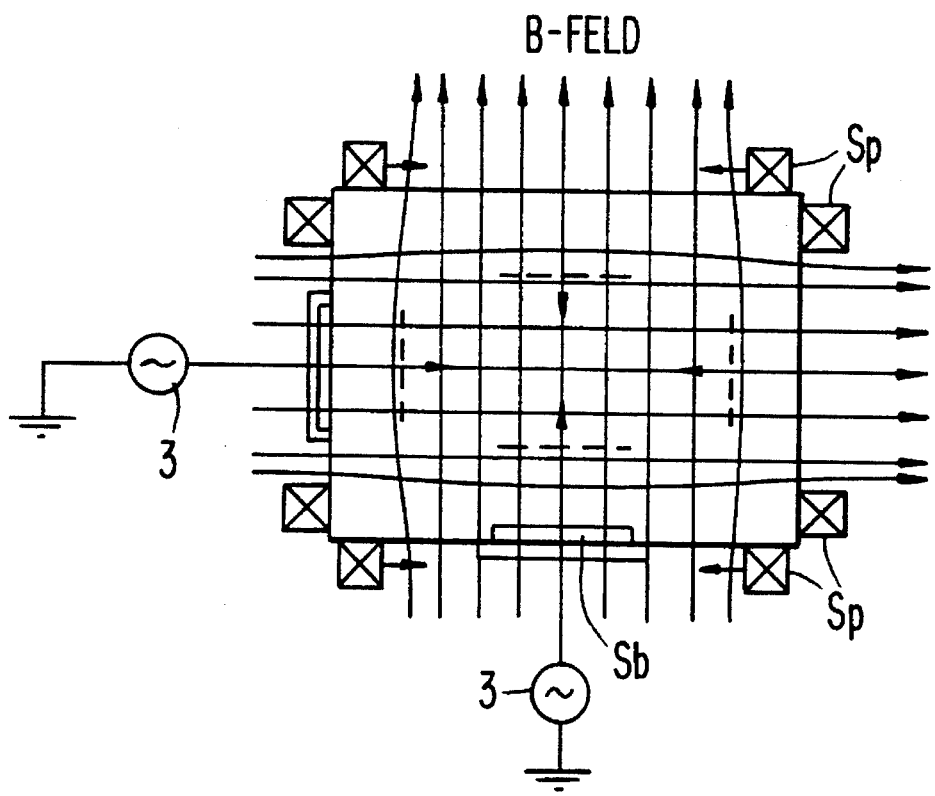

FIG. 4 shows another preferred embodiment of the present invention which represents a combination of the first and second preferred embodiments. This permits a greater range of variation in conducting the process from ion to neutral particle dominated treatment of the surface.

The power may be coupled-in via the substrate electrode K, respectively via a laterally disposed electrode E. Power coupling-in can also be switched between the two electrodes, respectively divided between them.

Furthermore, variable electrode spacing can also provide additional influencing of the plasma properties.

Prior to making this more apparent with reference to FIGS. 5 and 6, the measures provided in accordance with the present invention due to which there is a reduction of the plasma volume are summarized once more:

a) The leakage surfaces for the ions are reduced with the B-field; this leads to a greater increase in ionic density than in radical density (cf. also equation (7)).

In this way the ratio $a=A/A_r$ is very greatly influenced, in particular, in the event of a very small distance between the electrodes, because without the B-field the plasma cannot be held between the electrodes if the pressures are low and fills the entire recipient. Thus without the B-field, A is the entire chamber surface whereas with the B-field, A is the surface $h\pi d^2$ (h=the distance between the electrodes, d=the diameter of the electrode).

In addition to the ion leakage surface, the leakage surface $A_r$ for the radicals can also be altered. This is achieved, e.g., by utilizing a liner on the walls of the chamber, which, by means of selecting the suited material (high consumption rates for special radicals) results in an additional enlargement of the effective radical leakage surface A and thus to a further increase of a.

By way of illustration, in silicon etching (F etches Si spontaneously), the F-radical density can be additionally pressed out by a liner of silicon. An additional enlargement of the leakage surface $A_r$ can, e.g., be obtained by means of a suited geometric shape (e.g. lamellar structure in the case of heating elements or a corrugated surface, etc . . . ).

b) Due to the plasma being held between the electrodes when a B-field is utilized, an increase in power densities is attained with constant, uncoupled power. Particularly if the distance between the electrodes is small, a substantial increase in ionization rates (ionic densities) can be obtained thereby.

Variable spacing of electrodes is, in principle, known. Only a combination with the B-field provided in accordance with the present invention, however, permits enclosing the plasma in the electrode area even in the case of low pressures and high powers.

Figure 5A:
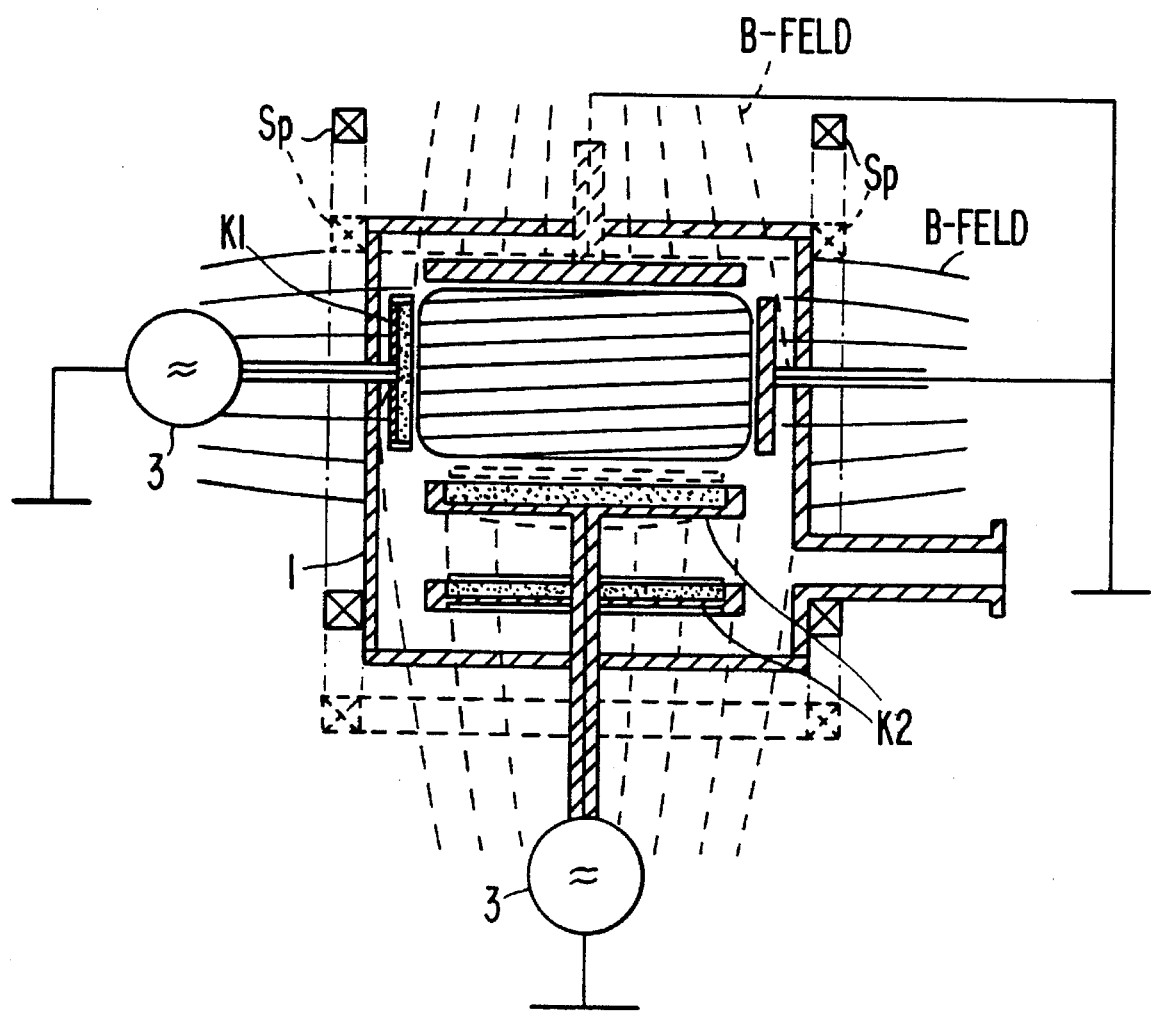
FIG. 5a to 5b illustrate an illustration of possible types of operation with an invented apparatus.
Figure 5B:
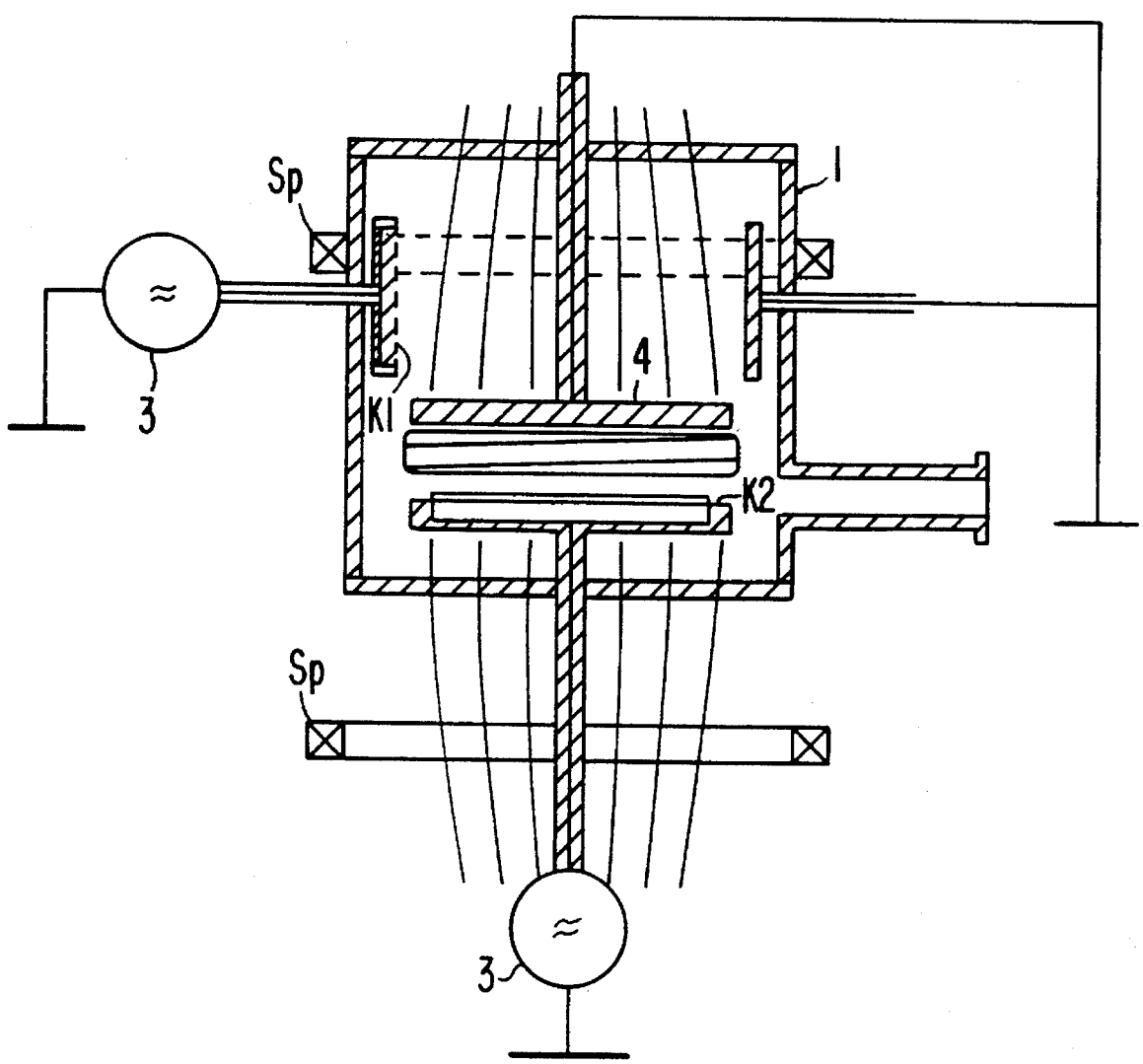

The variants having two powered electrodes, i.e. each connected to a high frequency power source illustrated in FIG. 4 also results in another new mode of operation, which is made more apparent in connection with FIGS. 5a and 5b:

1: The plasma burns between the pair of electrodes 1, with the axis of the B-field running perpendicular to the electrode K1. The wafer arranged on the electrode K2 is exposed to only a radical current in a first step if the distance to the plasma is adequate; in this way the electrode K2 is not powered so that the coil field having an axis perpendicular to K2 is switched off.

2. The electrode K2 can be switched on in a second step. Thus, depending on the power applied at K2, additional ions can be drawn onto the substrate; the coil field having an axis perpendicular to K2 can be switched on or off, respectively varied. The cathode K1 can continue to remain powered or switched off.

By this means, it is possible to switch from one of these different modes of operation to the other with practically any frequency. The possibility of randomly switching the coil fields, cathode power and cathode spacing opens a whole new series of different modes of operation in a single facility.

The above-mentioned reduction of the plasma volume is clearly illustrated once more in FIG. 5b.

In the preferred embodiment of the present invention illustrated in FIG. 5a, the electrode K2 can, furthermore, be moved for switching between "radical" and "switch" operation, whereas in the preferred embodiment illustrated in FIG. 5b, the counter electrode A is moved and the electrode K1 is switched off in order to reduce the plasma volume.

Moreover, the switch electrode can also be additionally powered.

What is claimed is:

1. An apparatus for plasma-enhanced processing of substrates, having a recipient in which ions and reactive neutral particles (radicals) which are generated in a plasma of a certain plasma volume acting on a substrate, comprising at least one electrical/magnetic field generating arrangement, which fields influence the kinematic of the ions generated in the plasma, said arrangement comprising:

two pairs of electrodes arranged perpendicular to each other, each having movable electrodes; and two magnetic field arrangements which generate variable magnetic fields crossing each other and wherein one of the magnetic fields is oriented parallel relative to a surface of the substrate.

2. An apparatus according to claim 1, further comprising a means for varying said plasma volume to alter an operating configuration of said recipient.

3. An apparatus according to claim 2, wherein said means for varying said plasma volume is at least one magnetic arrangement which generates a magnetic field.

4. An apparatus according to claim 3, wherein in order to increase a portion of positive ionic current density, a magnetic arrangement of said at least one magnetic arrangement generates a magnetic field, field lines of which run approximately perpendicular to said surface of said substrate.

5. An apparatus according to claim 3, wherein in order to increase said relative radical current density, a radical magnetic arrangement of said at least one magnetic arrangement generates a magnetic field, field lines of which run parallel to said surface of said substrate so that said ionic current density is reduced toward said substrate.

6. An apparatus according to claim 3, wherein said magnetic arrangement has a Helmholtz configuration.

7. An apparatus according to claim 4, wherein in order to increase said relative radical current density, a radical magnetic arrangement of said at least one magnetic arrangement generates a magnetic field, field lines of which run parallel to said surface of said substrate so that said ionic current density is reduced toward said substrate.

8. An apparatus according to claim 4, wherein said magnetic arrangement has a Helmholtz configuration.

9. An apparatus according to claim 5, wherein said radical magnetic arrangement has a Helmholtz configuration.

10. An apparatus according to claim 7, wherein said radical magnetic arrangement has a Helmholtz configuration.

* * * * *